United States Patent [19]
Brady

[11] Patent Number: 6,107,865
[45] Date of Patent: Aug. 22, 2000

[54] VSS SWITCHING SCHEME FOR BATTERY BACKED-UP SEMICONDUCTOR DEVICES

[75] Inventor: James Brady, Plano, Tex.

[73] Assignee: STMicroelectronics, Inc., Carrolton, Tex.

[21] Appl. No.: 09/429,964

[22] Filed: Oct. 29, 1999

Related U.S. Application Data

[63] Continuation of application No. 08/962,977, Oct. 31, 1997, abandoned.

[51] Int. Cl.[7] .................................................. H03F 3/01
[52] U.S. Cl. ........................... 327/537; 327/534; 327/546; 307/66; 307/87
[58] Field of Search .................................. 327/534, 537, 327/545, 546, 407, 408; 307/64, 66, 87

[56] References Cited

U.S. PATENT DOCUMENTS

| 3,676,717 | 7/1972 | Lockwood | 365/184 |
|---|---|---|---|
| 3,761,901 | 9/1973 | Aneshansley | 365/228 |
| 4,713,555 | 12/1987 | Lee | 307/66 |
| 4,715,016 | 12/1987 | Lamiaux et al. | 365/229 |
| 4,754,160 | 6/1988 | Ely | 307/64 |
| 4,862,610 | 9/1989 | Harrington, III | 361/58 |
| 5,181,091 | 1/1993 | Harrington, III et al. | 257/355 |
| 5,682,689 | 11/1997 | Williams et al. | 327/425 |

*Primary Examiner*—Terry D. Cunningham
*Attorney, Agent, or Firm*—Theodore E. Galanthay; Lisa K. Jorgenson; Renee M. Larson

[57] ABSTRACT

A battery backed-up semiconductor device employs a Vss switching configuration to provide uninterrupted battery power to critical circuitry of the device even in the event of external conditions, such as undershoot, that threaten to corrupt data stored by the device. Both primary power and battery power, when needed, are supplied to floating wells of the device rather than to the device substrate, making the device immune to undershoots that can short the battery to the device substrate and corrupt data stored by the device. The device substrate is permanently tied to the positive power supply voltage and the positive terminal of the battery voltage and is therefore not subject to the concerns associated with switching from a failed primary power supply to the back-up battery power supply.

9 Claims, 5 Drawing Sheets

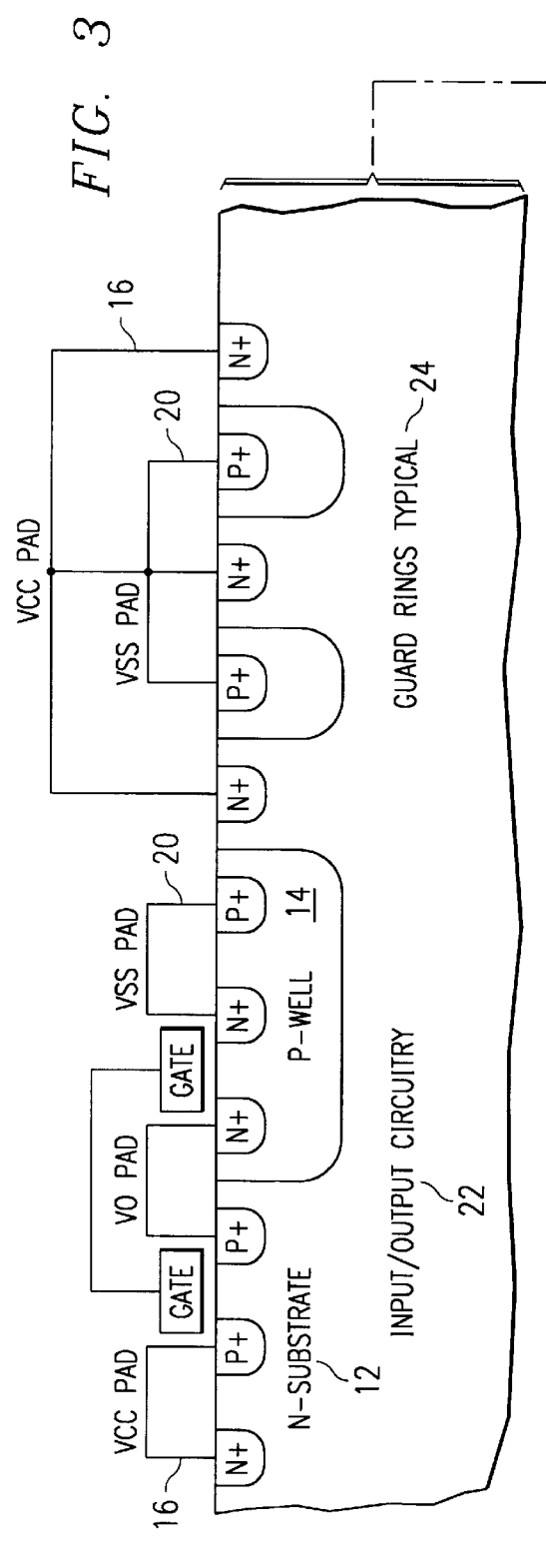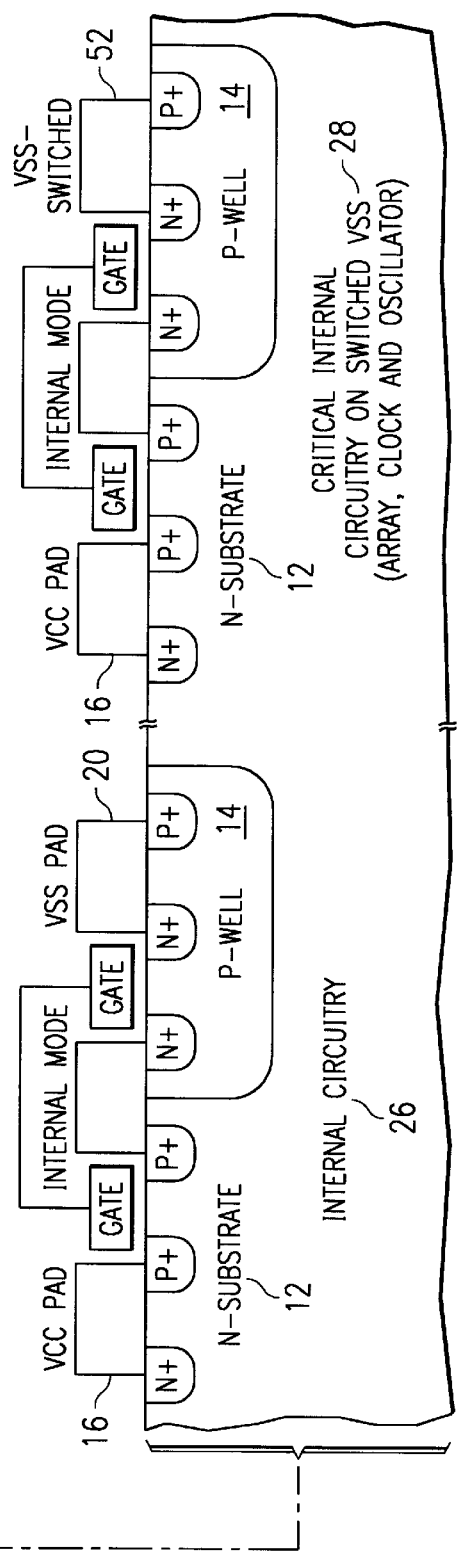
FIG. 3

VSS SWITCHING SCHEME FOR BATTERY BACKED-UP SEMICONDUCTOR DEVICES

This application is a continuation of application Ser. No. 08/962,977, filed Oct. 31, 1977, now abandoned, which is hereby incorporated by reference.

BACKGROUND OF THE INVENTION

1. Field of the Invention

This invention relates generally to battery backed-up semiconductor devices, and more particularly to a VSS switching scheme for battery backed-up semiconductor devices.

2. Background of the Invention

Battery backed-up semiconductor devices offer the advantage of providing uninterrupted power to the semiconductor device and are used in many types of applications, including 5 volt, 3.3 volt, and 3.0 volt applications. The semiconductor device is typically provided with power from a primary power supply, such as Vcc, so long as the primary power supply is adequate. When the primary power supply drops below an acceptable voltage level, however, the device switches from the primary power supply to the battery supply.

The configuration of the switching mechanism in a battery backed-up semiconductor device is determined by the semiconductor process used to manufacture the device. If the semiconductor manufacturing process uses an N-type substrate, the N-type substrate is connected to the positive supply voltage, normally Vcc. The switching of the voltage from the primary power supply to the battery for such an N-type substrate semiconductor device must occur in either the Vcc line located in the N-type substrate or the Vss located in the P-type wells of the device. It is common practice in the industry for battery backed-up semiconductors to accomplish this switching from the primary power supply to the back-up battery by placing a switch in the primary power supply, normally the Vcc supply, as demonstrated in FIG. 1.

Referring to FIG. 1, an N-type substrate, P-well, semiconductor device 10 using a typical Vcc switching configuration is shown. There are four parts of the semiconductor device that must be powered: the input/output circuitry 22 of the device, the guard rings 24 of the device, the internal circuitry 26 of the device, and critical internal circuitry 28 of the device. The input and output circuitry 22 is representative of any circuitry of the device, such as an input buffer and output driver, that is connected to a pad of the device. The guard rings 24 shown are just one implementation of guard rings that can be used to protect the circuitry internal to the device from internal bi-polar conditions to which the device is subjected. One of ordinary skill in the art will recognize that various types of guard ring configurations known in the industry may be used. Internal circuitry 26 is representative of internal circuitry of the device 10 that need not have power constantly supplied to it. Critical internal circuitry 28 refers to circuitry of the device 10 that must receive uninterrupted power in order to prevent data corruption of the device. Examples of critical internal circuitry 28 include array and/or clock and oscillator and support circuitry. For instance, as is well known in the art, a Zeropower® device will have an array and support circuitry only whereas a Timekeeper® device will have clock and oscillator and support circuitry and can be supplied with or without a memory array.

As shown in FIG. 1, there are potentially three voltages supplied to the semiconductor device: Vcc pad 16, Vcc-switched 18, and Vss pad 20. Vcc pad 16 is the primary power supply, such as 5 volts or 3.3 volts or 3.0 volts, depending on the type of system used, that is supplied to a pad of the device. Vcc-switched 18 is the battery backed-up power that is provided to the device when Vcc pad is no longer adequate to supply power to the device. Vss pad 20 is the nominal, or ground, voltage potential supplied to a pad of the device. The figure clearly shows that the Vcc pad and Vcc-switched voltages are both supplied to the N-substrate 12 of the device while the Vss pad is supplied to the P-wells 14 of the device. If the process were reversed to use a P-type substrate, the switching would occur in the Vcc line located in the N-type wells of the device.

Referring now to FIG. 2, a circuit representation 30 of the N-substrate, P-well Vcc switched device of FIG. 1 is shown. Control signals Vccok 34 and Vccok bar 36 control the switching of battery 32 in and out of the circuit 30. Sleep mode signal 38 is supplied to sleep mode latch 40 and is used to preserve the battery 32 of the device by selectively disabling the array 28a and clock & oscillator 28b so that the device may be shipped or stored. As in FIG. 1, input/output circuitry 22 is supplied with both the Vcc pad 16 and Vss pad 20 voltages. Array 28a and oscillator & clock 28b are examples of critical internal circuitry 28 and are supplied with Vss pad 20 and with either Vcc pad voltage 16 or Vcc-switched voltage 18 as controlled by Vccok signal 34 and Vccok bar signal 36; Vccok signal 34 and Vccok bar signal 36, as indicated by their signal names, reflect whether Vcc pad signal 16 is sufficient to supply voltage to the device. Thus, array 28a and oscillator & clock 28b are supplied with Vcc-switched voltage 18 only if Vcc pad voltage 16 becomes insufficient in magnitude as reflected in control signals Vccok 34 and Vccok bar 36.

There are problems associated with switching the substrate of the battery backed-up device between the primary power supply and the back-up battery as shown in FIGS. 1 and 2. An external event, such as an undershoot condition, while the device is being supplied by battery power, can short the potential across the high impedance battery path, thereby causing signals of the device to be shorted or coupled to the device substrate and corrupt data stored in the semiconductor device. When undershoot occurs on an input pad or an output pad of the device, a forward biased condition is formed from the well to the input or output pad which forms a bi-polar transistor shorting the input condition to the substrate. If the input event goes below ground, the substrate will follow with the normal emitter to drain voltage. Pulling Vcc down below ground creates paths internal to the device through which data stored by the device can be leaked.

It is therefore desirable to be able to provide switching between a primary power supply and a battery supply of a semiconductor device in a manner that prevents corruption of the device due to undershoots and other events that can cause corruption of data stored by the device.

SUMMARY OF THE INVENTION

According to the principles of the present invention, a battery backed-up N-substrate, P-well semiconductor device having Vss switching is provided. The Vss-switched semiconductor device includes input/output circuitry, internal circuitry and critical internal circuitry. The input/output circuitry is connected to the N-substrate of the semiconductor device and to one or more input/output P-wells of the semiconductor device. The N-substrate is permanently provided with a primary power supply and the one or more input/output P-wells are provided with a reference voltage. The internal circuitry is connected to the N-substrate and to one or more internal circuitry P-wells of the semiconductor device that are provided with the reference voltage. The critical internal circuitry is connected to the N-substrate and to one or more critical internal circuitry P-wells of the semiconductor device which are characterized as requiring uninterrupted power in order to prevent corruption of data stored in the semiconductor device. The one or more critical internal circuitry P-wells are provided with a switched reference voltage that provides power should the primary power supply fall outside an acceptable voltage range.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawings, wherein:

FIG. 3 is a cross-sectional view of an N-type substrate, P-well, semiconductor structure that uses a Vss switching configuration, according to the present invention;

DESCRIPTION OF THE INVENTION

The present invention provides an improved structure and method for switching a back-up battery in and out of a semiconductor device in a manner that does not allow undershoots to corrupt data stored by the device. Unlike in the prior art, both primary power and battery power, when needed, are supplied to the P-wells of an N-substrate device rather than to the substrate itself. By supplying power to floating wells of the device rather than to the device substrate, the device is immune to undershoots that can short the battery to the device substrate. The substrate of the device is permanently tied to the power supply voltage and the positive terminal of the battery voltage and is therefore not subject to the concerns associated with switching from a failed primary power supply to the back-up battery supply.

Figure 1:
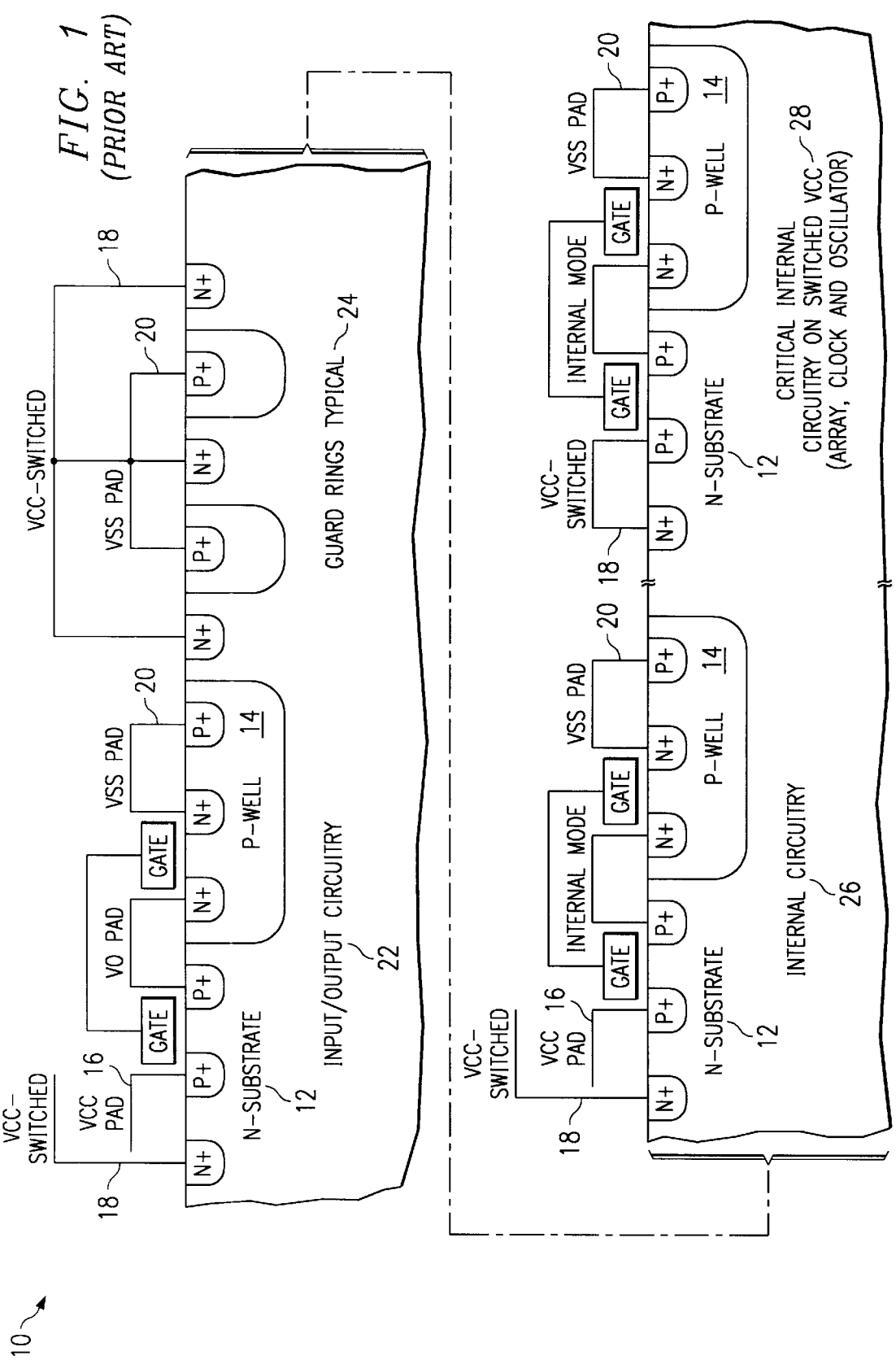
FIG. 1 is a cross-sectional view of an N-type substrate, P-well, battery backed-up semiconductor structure that uses a typical Vcc switching configuration, according to the prior art.
Figure 2:
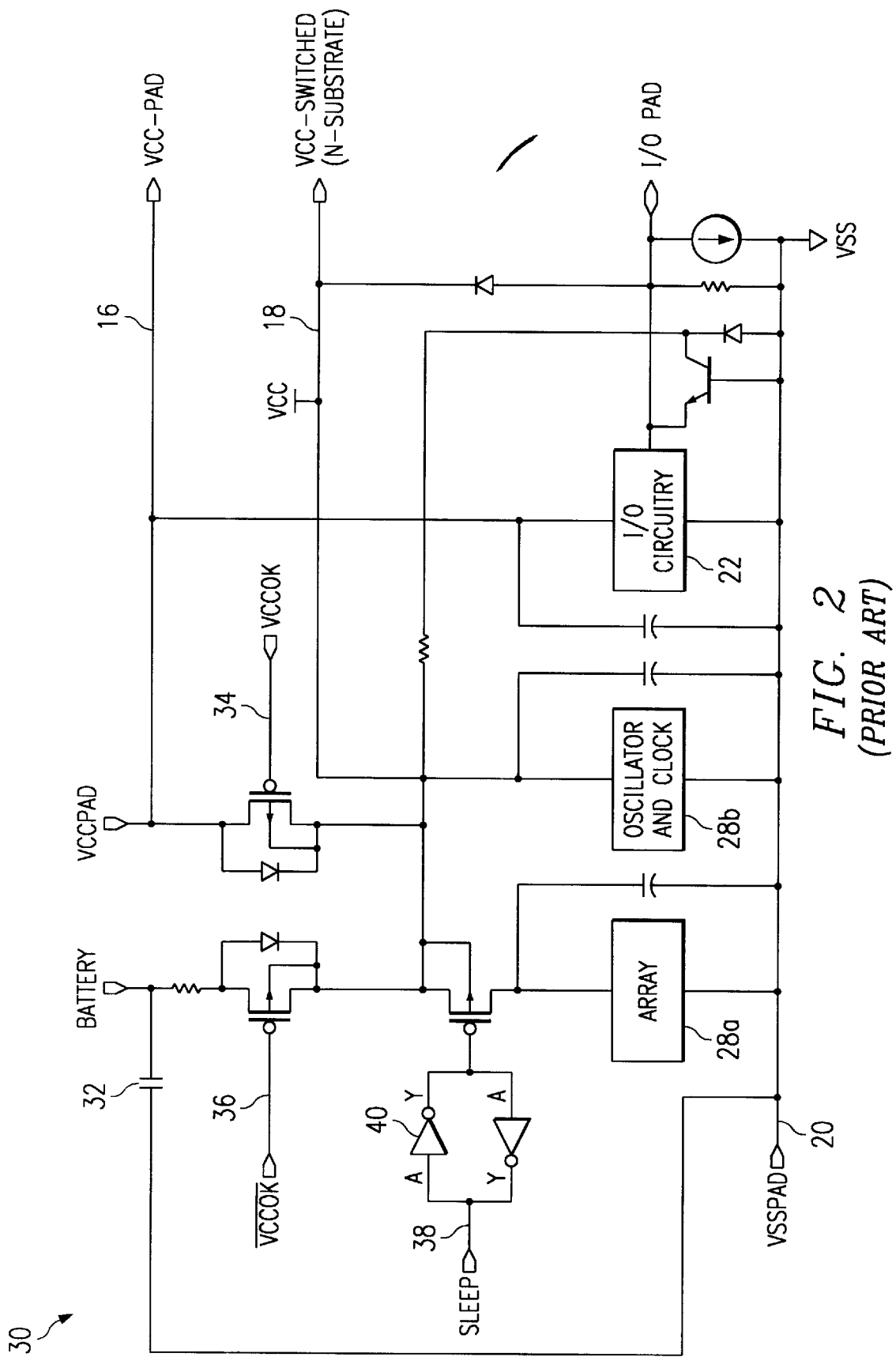
FIG. 2 is a circuit representation of the N-substrate, P-well Vcc switched semiconductor structure of FIG. 1, according to the prior art.

Referring to FIG. 3, an N-type substrate, P-well, semiconductor device 50 using a Vss switching configuration, according to the present invention, is shown. As in FIGS. 1 and 2, the four parts of the semiconductor device that must be powered include the input/output circuitry 22 of the device, the guard rings 24 of the device, the internal circuitry 26 of the device, and critical internal circuitry 28 of the device. The input and output circuitry 22 is representative of any circuitry of the device, such as an input buffer and output driver, that is connected to a pad of the device. The guard rings 24 shown are just one implementation of guard rings that can be used to protect the circuitry internal to the device from external bi-polar conditions to which the device is subjected. One of ordinary skill in the art will recognize that various types of guard ring configurations known in the industry may be used. Internal circuitry 26 is representative of internal circuitry of the device 50 that need not have power constantly supplied to it. Critical internal circuitry 28 refers to circuitry of the device 50 that must receive uninterrupted power in order to prevent data corruption of the device. Examples of critical internal circuitry 28 include array and/or clock and oscillator circuitry.

There are potentially three voltages supplied to the semiconductor device: Vcc pad 16, Vss pad 20, and Vss-switched 52. Vcc pad 16 is the primary power supply, such as 5 volts or 3.3 volts or 3.0 volts, that is supplied to a pad of the device. Vss-switched 52 is the battery backed-up power that is provided to the device when Vcc pad is no longer adequate to supply power to the device. Vss pad 20 is the nominal, or ground, voltage potential supplied to a pad of the device. The N-type substrate 12 is directly connected to Vcc. Unlike the prior art configuration, the P-wells associated with all input and output circuitry 22, as well as non-critical internal circuitry 26 that is not necessary to maintain during a battery back-up mode, is connected to the Vss reference voltage, Vss pad 20. The switched battery power, Vss-switched voltage 52, is only supplied to critical internal circuitry 28, such as the array, clock & oscillator, that must remain powered-up during battery back-up in order to prevent data corruption of the device.

Figure 4:
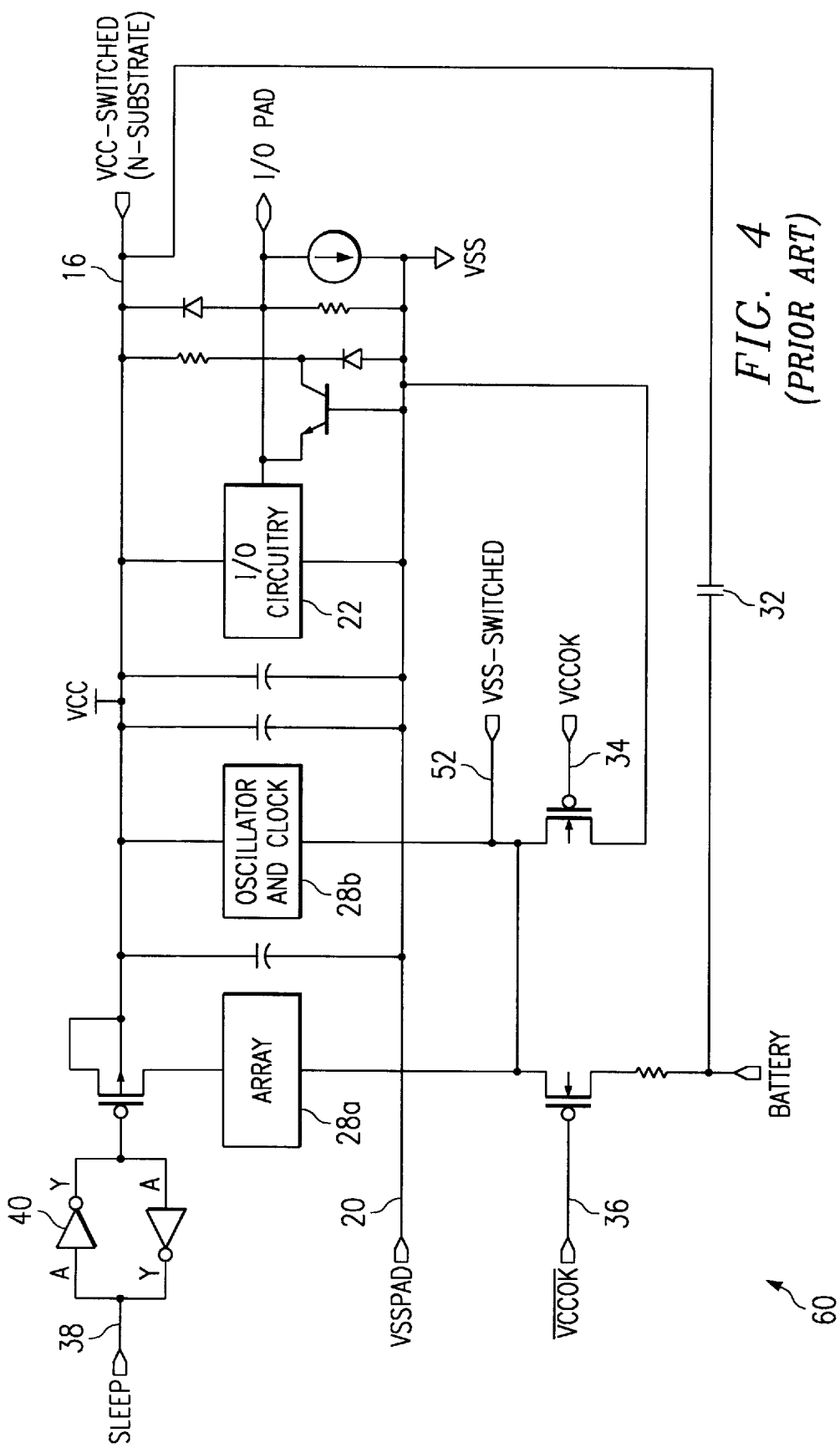
FIG. 4 is a circuit representation of the N-substrate, P-well Vss switched semiconductor structure of FIG. 3, according to the present invention.

The present invention is further illustrated in FIG. 4, a circuit representation 60 of the N-substrate, P-well Vss switched device of FIG. 3. Control signals Vccok 34 and Vccok bar 36 control the switching of battery 32 in and out of the circuit 60 of the semiconductor device. Sleep mode signal 38 is supplied to sleep mode latch 40 and is used to preserve the battery 32 of the device by selectively disabling the array 28a and clock & oscillator 28b so that the device may be shipped or stored. As in FIG. 3, input/output circuitry 22 is supplied with both the Vcc pad 16 and Vss pad 20 voltages. Array 28a and oscillator & clock 28b, examples of critical internal circuitry 28, are supplied with Vcc pad voltage 16 and Vss-switched voltage 52 in the event that Vcc pad voltage 16 proves to be inadequate. Vccok signal 34 and Vccok bar signal 36 reflect whether Vcc pad signal 16 is sufficient to supply voltage to the device 50. Thus, array 28a and oscillator & clock 28b are supplied with Vss-switched voltage 52 only if Vcc pad voltage 16 becomes insufficient as reflected by control signals Vccok 34 and Vccok bar 36.

In the present invention, then, there are two different voltage potentials supplied to the P-wells of the N-substrate device. First, there is the Vss pad voltage 20 that is always supplied to the P-wells associated with input/output circuitry 22, the guard rings 24, and internal circuitry 26. These P-wells remain at zero volts in reference to Vss. Second, there is the Vss-switch voltage 52 that is only supplied to the P-wells associated with critical internal circuitry 28 when the Vcc pad voltage 16 is no longer sufficient to supply this circuitry. The P-wells associated with critical internal circuitry 28, then, switch between zero volts and the negative battery voltage when the primary power supply proves to be inadequate. The positive battery terminal is tied to Vcc pad voltage 16 so that there is a voltage swing approximately equal to the full battery voltage, for instance, three volts, in the Vss potential of the switched supply as Vcc goes from zero to its full voltage potential and then back to zero volts.

Figure 5:
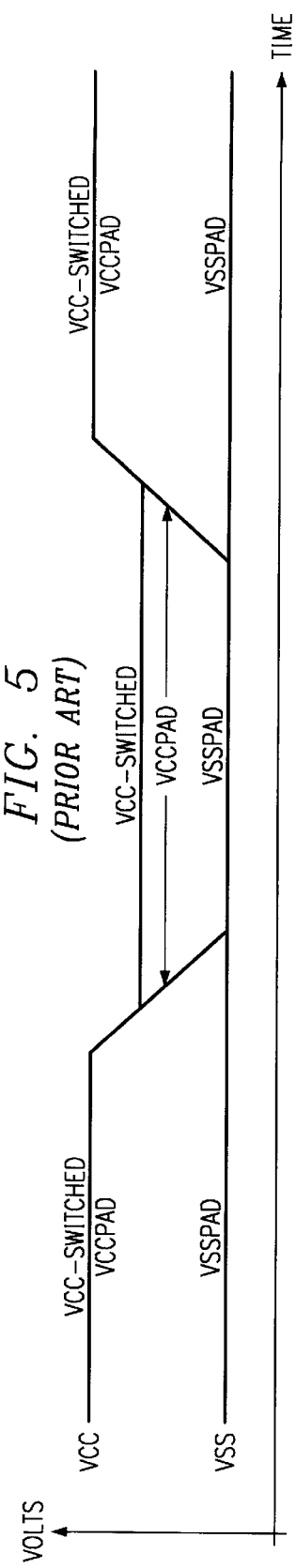
FIG. 5 is a waveform of the prior art N-substrate, P-well device Vcc switched semiconductor structure of FIGS. 1 and 2, according to the prior art.
Figure 6:
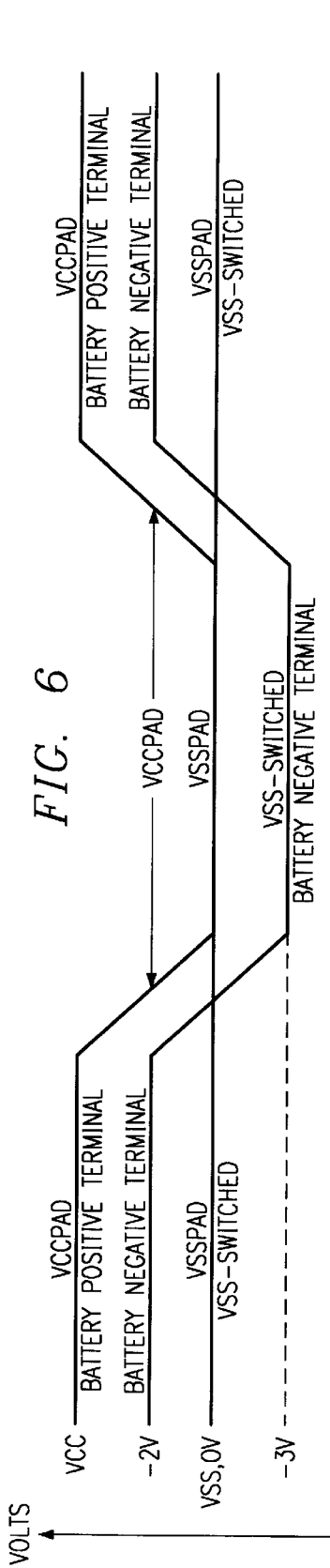
FIG. 6 is a waveform of the N-substrate, P-well device Vcc switched semiconductor device of FIGS. 3 and 4 in which Vcc is 5 volts, according to the present invention.
Figure 7:
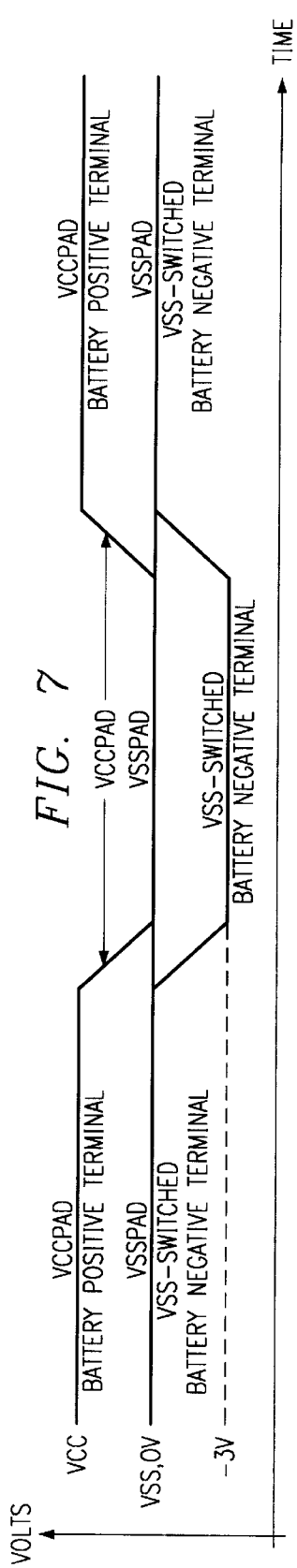
FIG. 7, is a waveform of the N-substrate, P-well device Vcc switched semiconductor device of FIGS. 3 and 4 in which Vcc is 3 volts, according to the present invention.

This is further illustrated by the waveforms of FIGS. 5–7. FIG. 5 illustrates the waveform representative of the prior art N-substrate, P-well device with switched Vcc shown in FIGS. 1 and 2. In FIG. 6, the N-substrate, P-well device of a 5 volt semiconductor device having the switched Vss of the present invention is shown. The positive battery terminal is tied to the Vcc pad voltage of 5 volts. The negative battery terminal is tied to two volts and when there is a switch from primary power to battery power, the negative terminal of the battery experiences a voltage swing, equal to the full battery voltage of five volts, from positive two volts to minus three volts. Similarly, in FIG. 7, the N-substrate, P-well device of a 3 volt or a 3.3 volt semiconductor device having the switched Vss of the present invention is shown. The positive battery terminal is tied to the Vcc pad voltage of 5 volts. The negative battery terminal is equal to the Vss pad 20, or zero volts, and when there is a switch from primary power to battery power, the negative terminal of the battery experiences a voltage swing, equal to the full battery voltage of three volts, from zero volts to minus three volts.

An example of switching circuitry that may be used to effect switching between power supplies of a battery backed-up semiconductor device is disclosed in U.S. Pat. No. 5,517,153 to Yin et al., issued May 14, 1996, which is herein incorporated by reference. In U.S. Pat. No. 5,517,153, a power supply switching circuit in an integrated circuit having P-wells or N-wells that allows for switching between Vcc and a battery is disclosed. This technology could be applied to accomplish power supply switching in the present invention. However, since the switched voltage of the present invention is Vss rather than Vcc, some connections of the switching circuitry of the U.S. Pat. No. 5,517,153 patent would have to be changed accordingly. One skilled in the art will recognize that such changes may be readily made to implement the invention of the U.S. Pat. No. 5,517,153 patent in the P-well Vss switched device of the present invention.

Referring again to FIGS. 3 and 4 of the invention, the internal switched Vss supply 52 is provided only to critical internal circuitry 28 so that there is no direct path from the internal switched Vss supply 52 to any of the external pads of the device. The external pads, shown as input/output circuitry 22, include input/output pads, input pads and voltage supply pads of the device. The lack of a direct path results in a low impedance path on all pads during all modes of operation, even during switching from the primary power supply to battery back-up power. The low impedance path of the present invention therefore ensures that external events, such undershoot conditions, that may occur in either in a primary power mode or a battery back-up mode, will not operate to short the voltage potential of the device across a high impedance battery path.

While the invention has been particularly shown and described with reference to a preferred embodiment, it will be understood by those skilled in the art that various changes in form and detail may be made therein without departing from the spirit and scope of the invention.

What is claimed is:

1. A battery backed-up N-substrate, P-well semiconductor device, comprising:

input/output circuitry connected to an N-substrate of the semiconductor device and having one or more input/output P-wells, wherein the N-substrate is directly connected to a primary power supply and to a battery and the one or more input/output P-wells are provided with a reference voltage of the primary power supply;

internal circuitry connected to the N-substrate of the semiconductor device and having one or more internal circuitry P-wells, wherein the one or more internal circuitry P-wells are provided with the reference voltage; and critical internal circuitry, connected to the N-substrate of the semiconductor device and having one or more critical internal circuitry P-wells, that must receive uninterrupted power in order to prevent corruption of data stored in the semiconductor device, wherein the reference voltage of the primary power supply is provided to the one or more critical internal circuitry P-wells until the primary power supply drops below a predetermined voltage level responsive to a switching circuit controlled by a control signal and when the primary power supply drops below the predetermined voltage level the one or more critical internal circuitry P-wells are provided with a battery reference voltage from the battery to provide the critical internal circuitry with uninterrupted power responsive to the switching circuit.

2. The device of claim 1, wherein the input/output circuitry is connected to a plurality of external pads of the device.

3. The device of claim 1, wherein the critical internal circuitry comprises an array and a clock and oscillator circuit.

4. The device of claim 1, wherein the critical internal circuitry comprises a clock and oscillator circuit.

5. The device of claim 1, wherein the critical internal circuitry comprises an array.

6. The device of claim 1, wherein because the battery reference voltage is supplied only to the critical internal circuitry there is not a direct path between the battery reference voltage and the plurality of external pads of the device.

7. A method for providing battery back-up power to an N-substrate, P-well semiconductor device, comprising the steps of:

providing a supply voltage from a primary power supply and a battery supply voltage of a battery to an N-substrate of the semiconductor device;

providing a nominal voltage to one or more input/output P-wells of input/output circuitry of the semiconductor device, wherein the input/output circuitry is connected to the N-substrate;

providing the nominal voltage to one or more internal circuitry P-wells of internal circuitry of the semiconductor device, wherein the internal circuitry is connected to the N-substrate;

providing the nominal voltage of the primary power supply to one or more critical internal circuitry P-wells of critical internal circuitry that is connected to the N-substrate of the semiconductor device until the primary power supply drops below a predetermined voltage level;

providing a battery reference voltage from the battery to the one or more critical internal circuitry P-wells of the semiconductor device when the primary power supply drops below the predetermined voltage level to ensure that the critical internal circuitry receives uninterrupted power to prevent corruption of data stored in the semiconductor device.

8. A method for providing power directly to a substrate of an N-substrate, P-well semiconductor device while allowing the use of a backup voltage on the N-substrate, P-well semiconductor device, comprising the steps of:

provi ding a supply voltage from a primary power supply and a battery supply voltage of a battery to an N-substrate of the semiconductor device;

providing a reference voltage of the primary power supply to one or more critical internal circuitry P-wells of critical internal circuitry that is connected to the N-substrate of the semiconductor device until the primary power supply drops below a predetermined voltage level;

providing a battery reference voltage from the battery to the one or more critical internal circuitry P-wells when the primary power supply drops below the predetermined voltage level to ensure that the critical internal circuitry receives uninterrupted power to prevent corruption of data stored in the semiconductor device, and wherein a low impedance path on a plurality of external pads of the input/output circuitry to the N-substrate ensures that the data stored in the semiconductor device is protected from an undershoot condition on one or more external pads of the plurality of external pads.

9. The method of claim 8, further comprising the steps of:

providing the reference voltage to one or more input/output P-wells of input/output circuitry of the semiconductor device; and providing the reference voltage to one or more internal circuitry P-wells of internal circuitry of the semiconductor device.

* * * * *